United States Patent
Park

(10) Patent No.: US 7,843,734 B2
(45) Date of Patent: Nov. 30, 2010

(54) FLASH MEMORY DEVICE AND DATA I/O OPERATION METHOD THEREOF

(75) Inventor: Jin Su Park, Daegu (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/396,392

(22) Filed: Mar. 2, 2009

(65) Prior Publication Data

US 2009/0168528 A1 Jul. 2, 2009

Related U.S. Application Data

(63) Continuation of application No. 11/479,130, filed on Jun. 30, 2006, now Pat. No. 7,499,323.

(30) Foreign Application Priority Data

May 12, 2006 (KR) .............. 10-2006-0042976

(51) Int. Cl.
*G11C 11/34* (2006.01)
*G11C 16/04* (2006.01)
*G11C 7/00* (2006.01)
*G11C 8/00* (2006.01)

(52) U.S. Cl. .............. 365/185.11; 365/185.12; 365/189.05; 365/189.16; 365/189.17; 365/230.03

(58) Field of Classification Search .......... 365/185.11, 365/185.12, 191, 196, 230.03, 189.05
See application file for complete search history.

(56) References Cited

U.S. PATENT DOCUMENTS

| | | | |
|---|---|---|---|
| 5,625,590 A * | 4/1997 | Choi et al. ............. | 365/185.17 |
| 6,937,510 B2 * | 8/2005 | Hosono et al. ......... | 365/185.03 |
| 6,963,502 B2 * | 11/2005 | Park ...................... | 365/185.11 |
| 7,064,993 B2 | 6/2006 | Gyohten et al. | |
| 7,239,561 B2 | 7/2007 | Park | |
| 7,301,827 B2 | 11/2007 | Anzai et al. | |
| 7,349,256 B2 | 3/2008 | Park et al. | |
| 2004/0027857 A1 * | 2/2004 | Ooishi ................... | 365/185.11 |

FOREIGN PATENT DOCUMENTS

JP         08-129890 A         5/1996

(Continued)

*Primary Examiner*—Ly D Pham
(74) *Attorney, Agent, or Firm*—Townsend and Townsend and Crew LLP

(57) ABSTRACT

A flash memory device comprises a memory cell array, an input buffer unit, an output driver unit, first and second page buffer units, and first and second data handling units. The memory cell array includes two or more memory banks. During a data input operation, the first and second data handling units respectively receive first and second input data from the input buffer unit, and transfer the first and second input data to the first and second page buffers alternately after receiving the external address signals. During a data output operation, the first and second data handling units respectively receive first and second output data from the first and second page buffer units, and transfer the first and second input data to the output driver unit alternately after receiving the external address signals, so that the output driver unit outputs the first and second input data to the external device alternately.

10 Claims, 10 Drawing Sheets

FOREIGN PATENT DOCUMENTS

| | | | |
|---|---|---|---|
| JP | 2003-007052 A | 1/2003 |
| KR | 1995-0034253 B1 | 12/1995 |
| KR | 100140179 B1 | 3/1998 |
| KR | 10-2001-0005149 A | 1/2001 |
| KR | 10-2006-0030172 A | 4/2006 |

* cited by examiner

FLASH MEMORY DEVICE AND DATA I/O OPERATION METHOD THEREOF

BACKGROUND

The present invention relates generally to semiconductor memory devices, and more particularly, to a flash memory device and a data I/O operation method thereof.

A flash memory device executes a program operation, a read operation, and an erase operation. The program operation and the read operation of the flash memory device are executed on a page basis.

In more detail, during the program operation of the flash memory device, externally input data are input and stored in page buffers, respectively, through a data input circuit. Thereafter, the data stored in the page buffers are programmed into memory cells included in a selected page of a memory cell array. Furthermore, during the read operation of the flash memory device, output data respectively read from the memory cells included in the selected page are stored in the page buffers, respectively, and are then output to an external device through a data output circuit.

Meanwhile, as semiconductor fabrication technology advances, semiconductor devices operating at higher speeds have been developed. As a result, there is a tendency that the operating speed of flash memory devices applied to semiconductor devices operating at high speeds has also gradually increased. Since the program or read operation process of the flash memory device includes the data input or output process, they require a relatively long time compared with its erase operation process. Therefore, in order to improve the operating performance of the flash memory device (i.e., to increase the operating speed), it is important to reduce a time taken in the data input or output process of the flash memory device.

SUMMARY OF THE INVENTION

An embodiment of the present invention provides a flash memory device comprising page buffers divided into two or more groups, in which data I/O operations of the page buffers of the divided two or more groups are executed in an interleaving manner, thereby increasing a data I/O speed.

Another embodiment of the present invention provides a data input method of a flash memory device comprising page buffers divided into two or more groups, in which a data input operation of the page buffers of the divided two or more groups is executed in an interleaving manner, thereby increasing a data input speed.

Still another embodiment of the present invention provides a data output method of a flash memory device comprising executing a data output operation of page buffers divided into two or more groups in an interleaving manner, thereby increasing a data output speed.

A flash memory device according to an embodiment of the present invention comprises a memory cell array, an input buffer unit, an output driver unit, a first page buffer unit, a second page buffer unit, a first data I/O unit, and a second data I/O unit. The memory cell array includes two or more memory banks. The input buffer unit receives first input data or second input data from an external device in response to a chip enable signal. The output driver unit receives first internal output data or second internal output data and outputs first output data or second output data to the external device, in response to a read enable control signal. The first page buffer unit transmits the first input data to one of the two or more memory banks or senses and stores first read data read from one of the two or more memory banks. The second page buffer unit transmits the second input data to the remaining memory banks or senses and stores second read data read from the remaining memory banks. The first data I/O unit transmits the first input data, which are received from the input buffer unit, to the first page buffer unit or receives the first read data from the first page buffer unit and transmits the first internal output data to the output driver unit, in response to first control signals, first column selection signals, and a data input enable signal. The second data I/O unit transmits the second input data, which are received from the input buffer unit, to the second page buffer unit or receives the second read data from the second page buffer unit and transmits the second internal output data to the output driver unit, in response to second control signals, second column selection signals, and the data input enable signal. The first data I/O unit and the second data I/O unit alternately operate at a predetermined time interval.

According to another embodiment of the present invention, a data input method of a flash memory device comprises executing a first data input step of inputting first input data to one of two or more page buffer units respectively corresponding to two or more memory banks included in a memory cell array through a first data I/O unit; executing a second data input step of inputting second input data to the other of the two page buffer units through a second data I/O unit with a predetermined time interval intervened between the first data input step and the second data input step; and executing a step of alternately repeating the first data input step and the second data input step until the first and second input data to be programmed into one of a plurality of pages included in the two or more memory banks, respectively, are input to both the two or more page buffer unit.

According to still another embodiment of the present invention, a data output method of a flash memory device comprises executing a first data output step of outputting first read data, which are read from one of two or more memory banks by one of two or more page buffer units respectively corresponding to the two or more memory banks included in a memory cell array, to an external device as first output data through a first data I/O unit; executing a second data output step of outputting second read data read from the other of the two or more memory banks by the other of the two or more page buffer units with a predetermined time interval intervened between the first data output step and the second data output step, to the external device as second output data through a second data I/O unit; and executing a step of alternately repeating the first data output step and the second data output step until both the first and second read data read from one of a plurality of pages included in the two or more memory banks, respectively, are output to the external device as the first and second output data.

According to another embodiment, a non-volatile memory device includes a memory cell array including a plurality of memory banks, the plurality of memory banks including first and second memory banks. An input buffer unit that receives first input data or second input data from an external device in response to a chip enable signal. A first page buffer unit that receives the first input data and transmits the first input data to the first memory bank. A second page buffer unit that receives the second input data and transmits the second input data to the second memory bank. The non-volatile memory device further comprises a first data handling unit that receives the first input data from the input buffer and transmits the first input data to the first page buffer unit; and a second data handling unit that receives the second input data from the input buffer and transmits the second input data to the second page buffer unit, wherein the first data handling unit and the second data handling unit alternately operate at a predetermined time interval. The first and second data handling units are first and second I/O units, respectively.

According to another embodiment, a data input method of a flash memory device comprises executing a first data input step of inputting first input data to a first page buffer unit corresponding to a first memory bank included in a memory cell array; and executing a second data input step of inputting second input data to a second page buffer unit with a predetermined time interval intervened between the first data input step and the second data input step.

According to another embodiment, a data output method of a flash memory device comprises executing a first data output step of outputting first read data, which are read from a first memory bank by a first page buffer unit corresponding to the first memory bank included in a memory cell array, to an external device as first output data; executing a second data output step of outputting second read data read from a second memory bank by a second page buffer unit to the external device as second output data, wherein the first and second data output steps are performed with a predetermined time interval intervened between the first and second data output steps.

BRIEF DESCRIPTION OF THE DRAWINGS

A more complete appreciation of the invention will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

Figure 1:
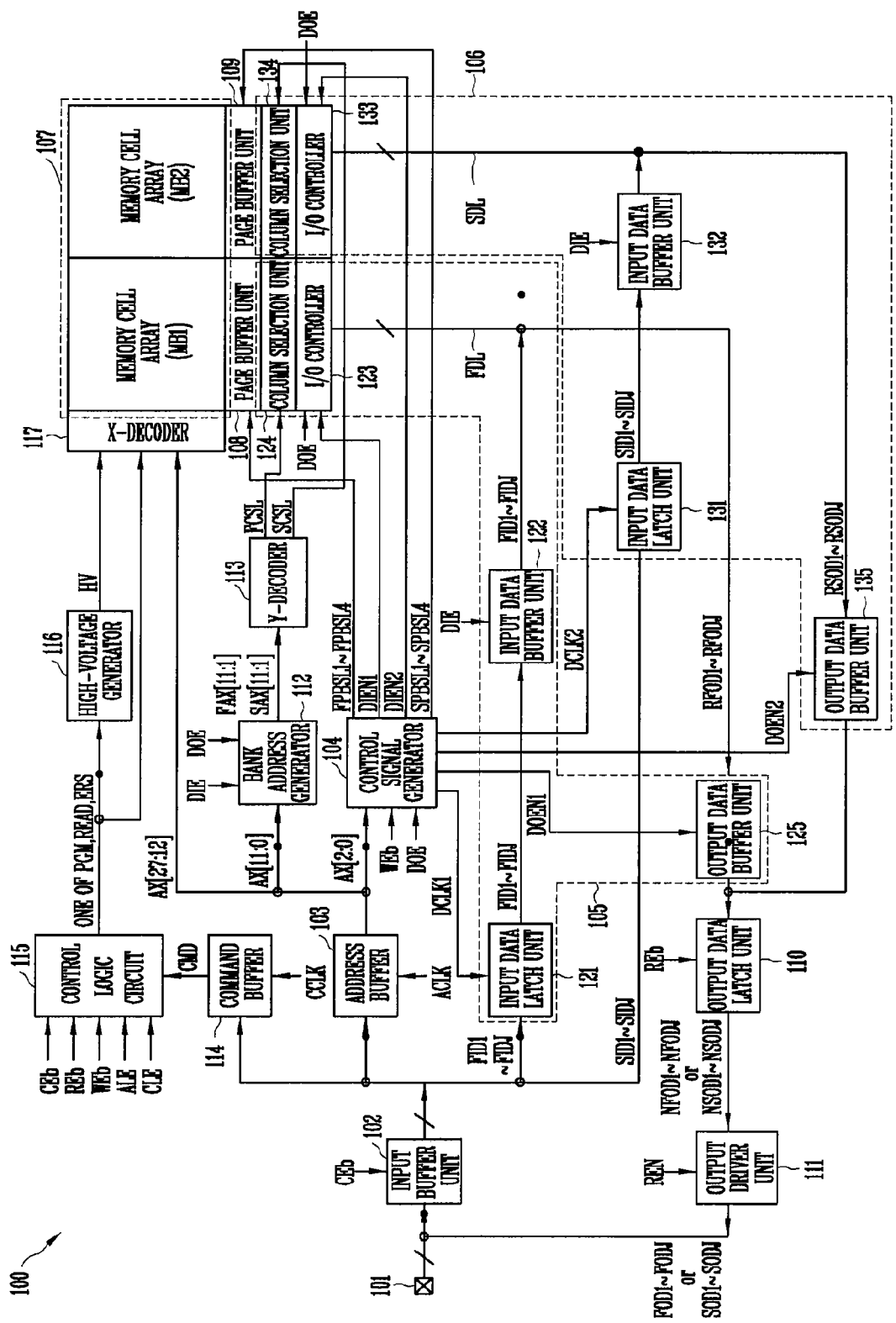
FIG. 1 is a block diagram schematically showing the structure of a flash memory device according to an embodiment of the present invention.

FIG. 1 is a block diagram schematically showing the structure of a flash memory device according to an embodiment of the present invention. A flash memory device 100 includes an input buffer unit 102, an address buffer 103, a control signal generator 104, data I/O units 105, 106, a memory cell array 107, page buffer units 108, 109, an output data latch unit 110, an output driver unit 111, a bank address generator 112, a Y-decoder 113, a command buffer 114, a control logic circuit 115, a high-voltage generator 116, and a X-decoder 117.

The input buffer unit 102 receives input data FID1 to FIDJ or SID1 to SIDJ (J is a positive integer), a command signal CMD or external address signals AX[27:0] from an external device (not shown) through an I/O pad 101 in response to a chip enable signal CEb. The input buffer unit 102 outputs the command signal CMD to the command buffer 114, the input data FID1 to FIDJ to the data I/O unit 105, and the input data SID1 to SIDJ to the data I/O unit 106. Furthermore, the input buffer unit 102 outputs the external address signals AX[27:0] to the address buffer 103.

The address buffer 103 receives the external address signals AX[27:0] in response to an address clock signal ACLK. The address buffer 103 outputs the external address signals AX[27:12] to the X-decoder 117, the external address signals AX[11:0] to the bank address generator 112, and the external address signals AX[2:0] to the control signal generator 104.

The control signal generator 104 generates control signals to control the operation of the data I/O units 105, 106 based on the external address signals AX[2:0], a write enable signal WEb, and a data output enable signal DOE. The control signals include latch clock signals DCLK1, DCLK2, data input control signals DIEN1, DIEN2, and data output control signals DOEN1, DOEN2.

Figure 2:
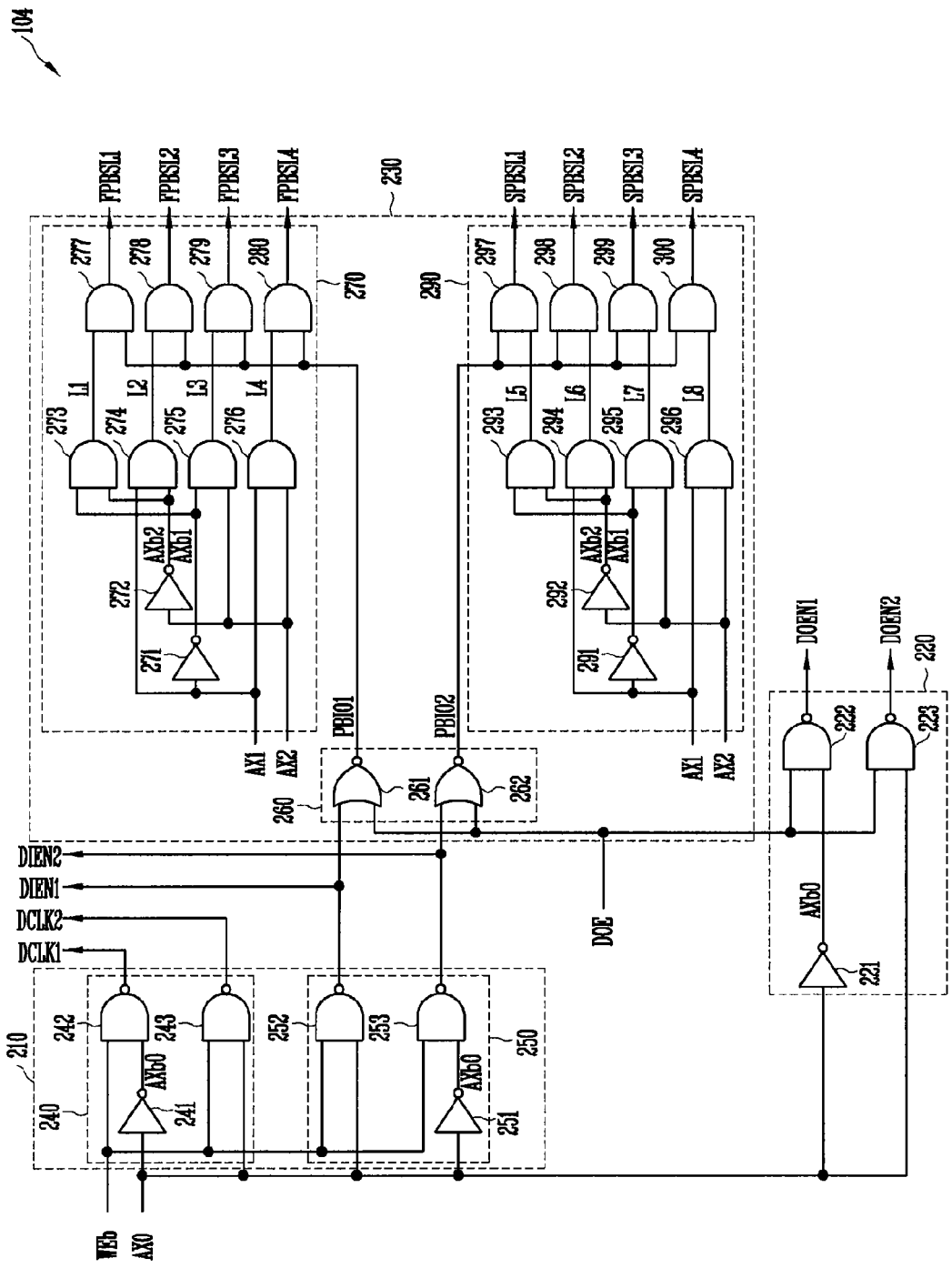
FIG. 2 is a detailed circuit diagram of a control signal generator shown in FIG. 1.

Referring to FIG. 2, the control signal generator 104 includes an input control circuit 210, an output control circuit 220, and a selection control circuit 230.

Figure 12:
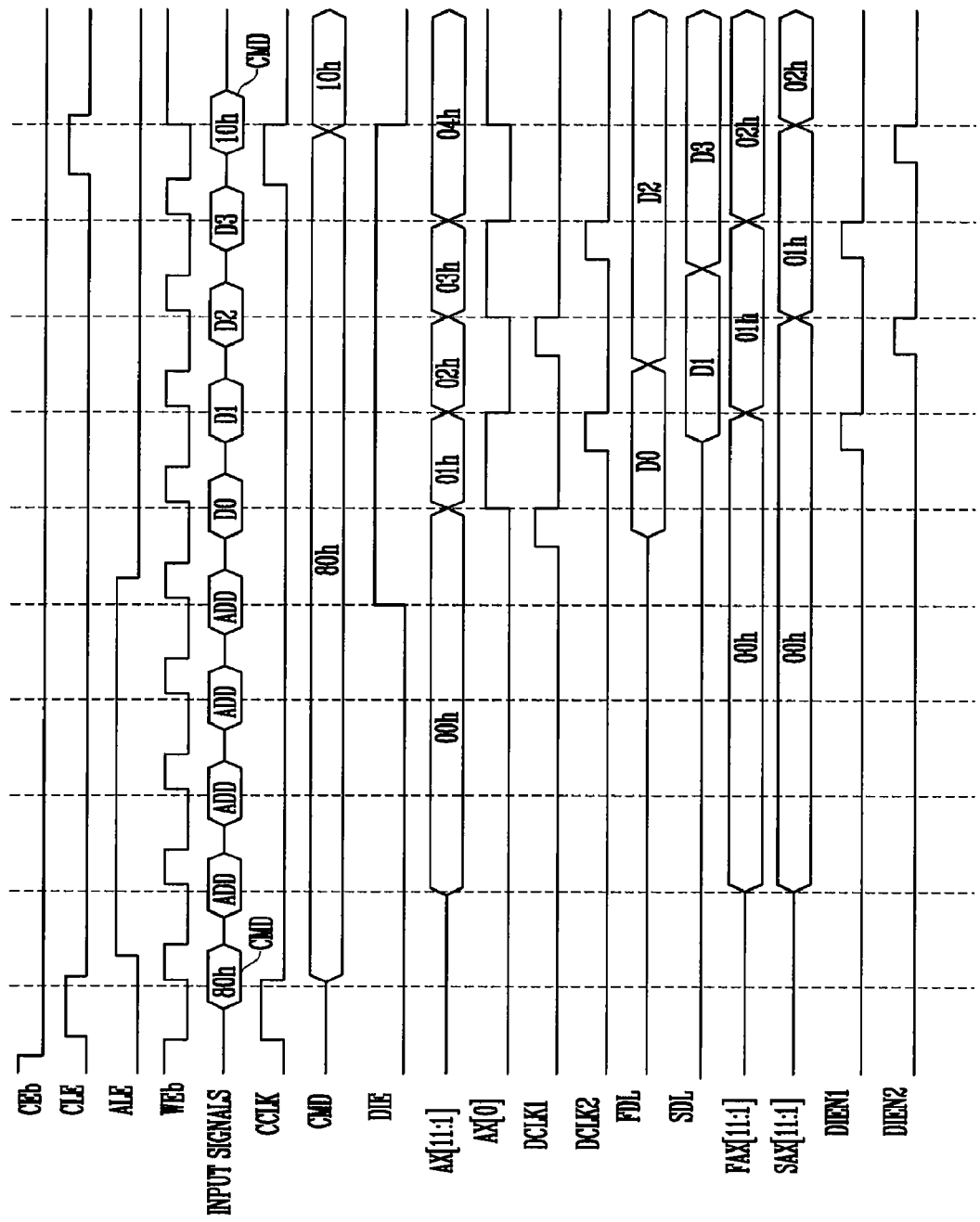
FIG. 12 is a timing diagram of signals related to a data input operation of the flash memory device shown in FIG. 1.

The input control circuit 210 includes logic circuits 240, 250. The logic circuit 240 includes an inverter 241 and NAND gates 242, 243. The inverter 241 inverts the external address signal AX0 and outputs an inverted external address signal AXb0. The NAND gate 242 outputs the latch clock signal DCLK1 in response to the write enable signal WEb and the inverted external address signal AXb0. The NAND gate 243 outputs the latch clock signal DCLK2 in response to the write enable signal WEb and the external address signal AX0. In some embodiments, when the write enable signal WEb and the external address signal AX0 are toggled respectively, the logic circuit 240 alternately toggles the latch clock signals DCLK1, DCLK2, as illustrated in FIG. 12.

The logic circuit 250 includes an inverter 251 and NAND gates 252, 253. The inverter 251 inverts the external address signal AX0 and outputs an inverted external address signal AXb0. The NAND gate 252 outputs the data input control signal DIEN1 in response to the write enable signal WEb and the external address signal AX0. The NAND gate 253 outputs the data input control signal DIEN2 in response to the write enable signal WEb and the inverted external address signal AXb0. In some embodiments, when the write enable signal WEb and the external address signal AX0 are respectively toggled, the logic circuit 250 alternately toggles the data input control signals DIEN1, DIEN2, as illustrated in FIG. 12.

The output control circuit 220 includes an inverter 221 and NAND gates 222, 223. The inverter 221 inverts the external address signal AX0 and outputs an inverted external address signal AXb0. The NAND gate 222 outputs the data output control signal DOEN1 in response to the data output enable signal DOE and the inverted external address signal AXb0. The NAND gate 223 outputs the data output control signal DOEN2 in response to the data output enable signal DOE and the external address signal AX0.

The selection control circuit 230 includes logic circuits 260, 270, 290. The logic circuit 260 includes OR gates 261, 262. The NOR gate 261 outputs a selection control signal PBIO1 in response to the data input control signal DIEN1 and the data output enable signal DOE. The NOR gate 262 outputs a selection control signal PBIO2 in response to the data input control signal DIEN2 and the data output enable signal DOE.

The logic circuit 270 includes inverters 271, 272 and AND gates 273 to 280. The inverter 271 inverts an external address signal AX1 and outputs an inverted external address signal AXb1. The inverter 272 inverts an external address signal AX2 and outputs an inverted external address signal AXb2. The AND gate 273 outputs a logic signal L1 in response to the inverted external address signals AXb1, AXb2. The AND gate 274 outputs a logic signal L2 in response to the external address signal AX1 and the inverted external address signal AXb2. The AND gate 275 outputs a logic signal L3 in response to the inverted external address signal AXb1 and the external address signal AX2. The AND gate 276 outputs a logic signal L4 in response to the external address signals AX1, AX2. The AND gates 277 to 280 output selection signals (or page buffer selection signals) FPBSL1 to FPBSL4, respectively, in response to the selection control signal PBIO1 and the logic signals L1 to L4, respectively. For example, the AND gate 277 may output the selection signal FPBSL1 in response to the logic signal L1 and the selection control signal PBIO1.

The logic circuit 290 outputs selection signals (or page buffer selection signals) SPBSL1 to SPBSL4 in response to the external address signals AX1, AX2 and the selection control signal PBIO2. The logic circuit 290 includes inverters 291, 292 and the AND gates 293 to 300. The operations of the inverters 291, 292 and the AND gates 293 to 300 are the same as those of the inverters 271, 272 and the AND gates 273 to 280, and will not be described for simplicity.

Referring back to FIG. 1, the data I/O unit 105 includes an input data latch unit 121, an input data buffer unit 122, an I/O controller 123, a column selection unit 124, and an output data buffer unit 125. The input data latch unit 121 latches the input data FID1 to FIDJ (J is a positive integer) received from the input buffer unit 102 in response to the latch clock signal DCLK1. The input data buffer unit 122 outputs the input data FID1 to FIDJ, which are received from the input data latch unit 121, to data lines FDL (i.e., DL1 to DLJ) (refer to FIG. 8), respectively, in response to the data input enable signal DIE. The I/O controller 123 outputs the input data FID1 to FIDJ, which are received through the data lines FDL, to data I/O nodes NIO1 to NIOJ, NIOB1 to NIOBJ (refer to FIG. 8), respectively, in response to the data input control signal DIEN1.

Furthermore, the I/O controller 123 reads the data RFOD1 to RFODJ, which are received through data I/O nodes NIO1 to NIOJ, NIOB1 to NIOBJ, to the data lines FDL, respectively, in response to the data output enable signal DOE. The column selection unit 124 selects some of a plurality of page buffers PBs included in the page buffer unit 108 and connects the selected page buffers to the data I/O nodes NIO1 to NIOJ, NIOB1 to NIOBJ, respectively, in response to the column selection signals FSCL (i.e., YA1 to YAT, YB1 to YBU) (refer to FIG. 8). The output data buffer unit 125 receives the read data RFOD1 to RFODJ from the I/O controller 123 through the data lines FDL and outputs internal output data NFOD1 to NFODJ, in response to the data output control signal DOEN1.

The data I/O unit 106 includes an input data latch unit 131, an input data buffer unit 132, an I/O controller 133, a column selection unit 134, and an output data buffer unit 135. The input data latch unit 131 latches the input data SID1 to SIDJ, which are received from the input buffer unit 102, in response to the latch clock signal DCLK2. The input data buffer unit 132 outputs the input data SID1 to SIDJ, which are received from the input data latch unit 131, to data lines SDL (i.e., DL1 to DLJ), respectively, in response to the data input enable signal DIE. The I/O controller 133 outputs the input data SID1 to SIDJ, which are received through the data lines SDL, to data I/O nodes NIO1 to NIOJ, NIOB1 to NIOBJ in response to the data input control signal DIEN2.

Furthermore, the I/O controller 133 outputs the read data RSOD1 to RSODJ, which are received through the data I/O nodes NIO1 to NIOJ, NIOB1 to NIOBJ, to the data lines SDL, respectively, in response to the data output enable signal DOE. The column selection unit 134 selects some of a plurality of page buffers PB included in the page buffer unit 109 to the data I/O nodes NIO1 to NIOJ, NIOB1 to NIOBJ, respectively, in response to column selection signals SCSL, YA1 to YAJ, and YB1 to YBJ. The output data buffer unit 135 receives the read data RSOD1 to RSODJ from the I/O controller 133 through the data lines SDL and outputs internal output data NSOD1 to NSODJ, in response to the data output control signal DOEN2.

The memory cell array 107 includes memory banks MB1, MB2. Each of the memory banks MB1, MB2 includes a plurality of memory cells (not shown).

The page buffer unit 108 transmits the input data FID1 to FIDJ to the memory bank MB1. Furthermore, the page buffer unit 108 senses and stores the read data RFOD1 to RFODJ read from the memory bank MB1.

The page buffer unit 109 transmits the input data SID1 to SIDJ to the memory bank MB2. Furthermore, the page buffer unit 109 senses and stores the read data RSOD1 to RSODJ read from the memory bank MB2.

The output data latch unit 110 latches the internal output data NFOD1 to NFODJ or NSOD1 to NSODJ read from the output data buffer unit 125 or 135 in response to a read enable signal REb.

The output driver unit 111 receives the internal output data NFOD1 to NFODJ or NSOD1 to NSODJ and outputs output data FOD1 to FODJ or SOD1 to SODJ to the external device through the I/O pad 101, in response to a read enable control signal REN. In some embodiments, the output driver unit 111 outputs the output data FOD1 to FODJ or SOD1 to SODJ to the external device when the read enable control signal REN becomes logic low.

The bank address generator 112 generates bank address signals FAX[11:1] and SAX[11:1] based on the external address signals AX[11:0], the data input enable signal DIE, and the data output enable signal DOE.

The Y-decoder 113 decodes the bank address signals FAX[11:1] and SAX[11:1] and generates the column selection signals FCSL, SCSL according to the decoding result.

The command buffer 114 receives a command signal CMD from the input buffer unit 102 and outputs it to the control logic circuit 115, in response to a command clock signal CCLK.

The control logic circuit 115 receives the command signal CMD from the command buffer 114 in response to the external control signals.

The control logic circuit 115 outputs any one of the program command PGM, the read command READ, and the erase command ERS in response to the command signal CMD. The external control signals include a chip enable signal CEb, a read enable signal REb, a write enable signal WEb, an address latch enable signal ALE, and a command latch enable signal CLE.

The high-voltage generator 116 generates a bias voltage HV corresponding to one of a program operation, a read operation, and an erase operation in response to any one of the program command PGM, the read command READ, and the erase command ERS.

The X-decoder 117 decodes the external address signal AX[27:12] received from the address buffer 103 and selects one of a plurality of memory cell blocks (not shown) or a plurality of pages (not shown), which are included in the memory banks MB1, MB2 of the memory cell array 107, respectively, according to the decoding result. For example, the X-decoder 117 may select one of a plurality of pages included in the memory cell array 107 in response to the program command PGM or the read command READ. Furthermore, the X-decoder 117 may select one of a plurality of memory cell blocks included in the memory cell array 107 in response to the erase command ERS. Each of the plurality of memory cell blocks includes a plurality of pages.

Figure 3:
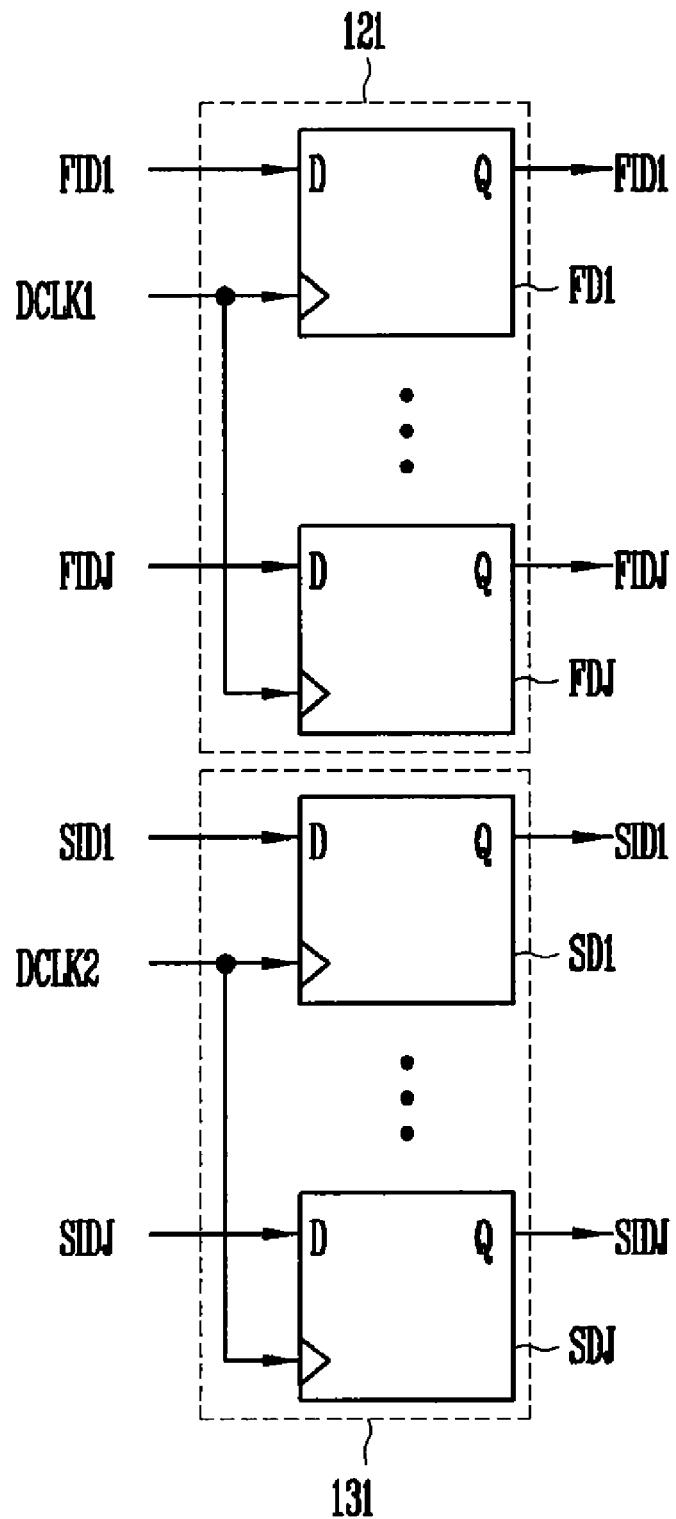
FIG. 3 is a detailed circuit diagram of input data latch units shown in FIG. 1.

FIG. 3 is a detailed circuit diagram of the input data latch units 121, 131 shown in FIG. 1. The input data latch unit 121 includes a plurality of input latches FD1 to FDJ. The input latches FD1 to FDJ latch the input data FID1 to FIDJ, respectively, in response to the latch clock signal DCLK1 and outputs the latched input data FID1 to FIDJ, respectively. For example, the input latch FD1 latches the input data FID1 in response to the latch clock signal DCLK1. The input data latch unit 131 includes a plurality of input latches SD1 to SDJ. The plurality of input latches SD1 to SDJ latch the input data SID1 to SIDJ, respectively, in response to the latch clock signal DCLK2 and outputs the latched input data SID1 to SIDJ, respectively. For example, the input latch SD1 latches the input data SID1 in response to the input clock signal DCLK2. In some embodiments, each of the input latches FD1 to FDJ and SD1 to SDJ may be implemented using a D flip-flop.

Figure 4:
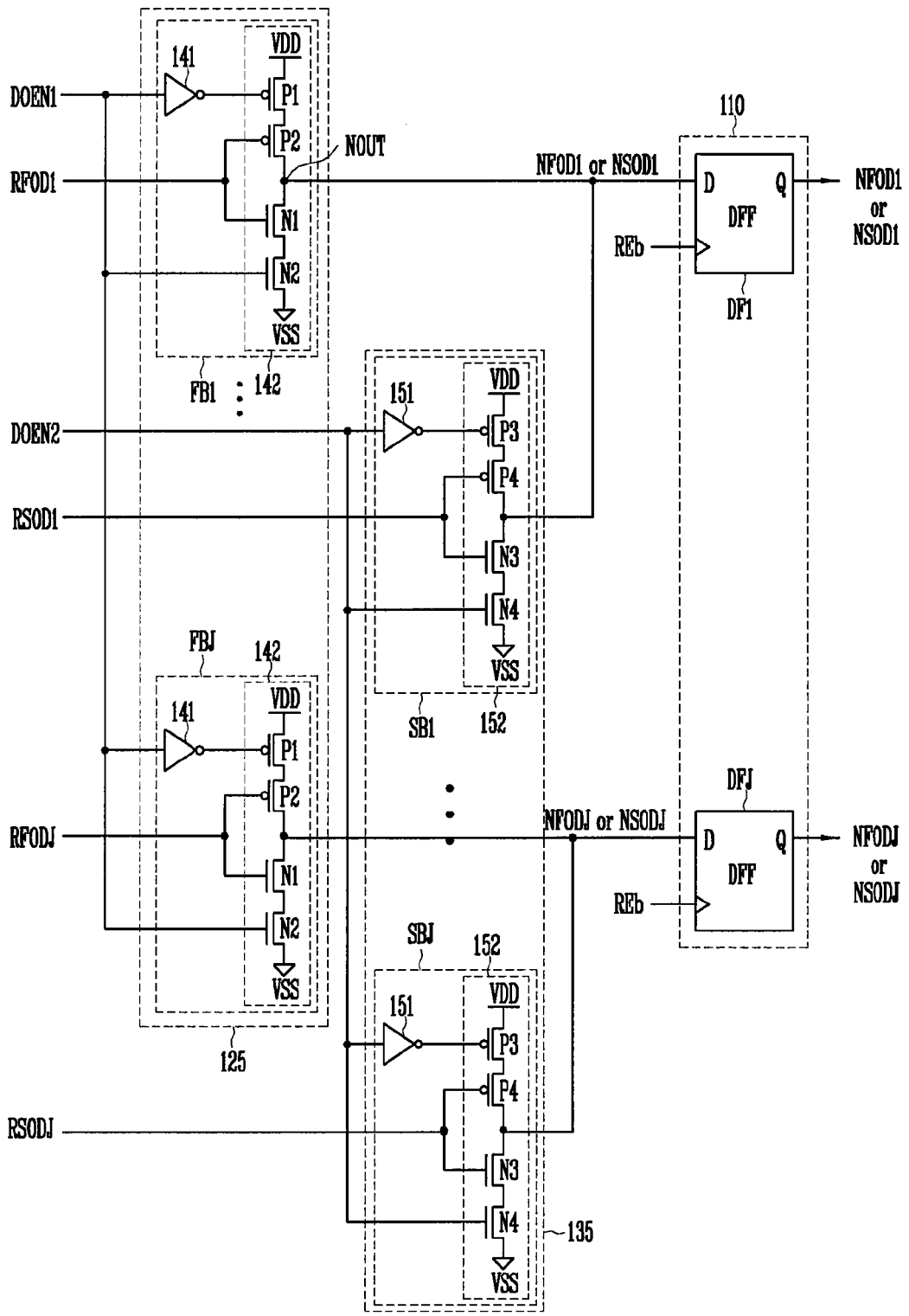
FIG. 4 is a detailed circuit diagram of output data buffer units and an output data latch unit shown in FIG. 1.

FIG. 4 is a detailed circuit diagram of the output data buffer units 125, 135 and the output data latch unit 110 shown in FIG. 1. The output data buffer unit 125 includes output buffers FB1 to FBJ. The output buffers FB1 to FBJ receive the read data RFOD1 to RFODJ, respectively, and output the internal output data NFOD1 to NFODJ, respectively, in response to the data output control signal DOEN1. The output buffers FB1 to FBJ have substantially the same construction and operation. The construction and operation of the output buffer FB1 is described below as an example. The output buffer FB1 includes inverters 141, 142. The inverter 141 inverts the data output control signal DOEN1 and outputs an inversed data output control signal DOEN1B. The inverter 142 includes PMOS transistors P1, P2 and NMOS transistors N1, N2. The PMOS transistor P1 has a source connected to an internal voltage VDD and has a gate to which the inversed data output control signal DOEN1B is input. The PMOS transistor P2 has a source connected to a drain of the PMOS transistor P1, a drain connected to a node NOUT, and a gate to which the read data RFOD1 are input. The NMOS transistor N1 has a drain connected to the node NOUT and a gate to which the read data RFOD1 are input. The NMOS transistor N2 has a drain connected to a source of the NMOS transistor N1, a source connected to a ground voltage VSS, and a gate to which the data output control signal DOEN1 are input. In some embodiments, when the data output control signal DOEN1 is enabled, the PMOS transistor P1 and the NMOS transistor N2 are turned on. As a result, when the data output control signal DOEN1 is enabled, the inverter 142 inverts the read data RFOD1 and outputs an inverted signal to the node NOUT as internal output data NFOD1.

The output data buffer unit 135 includes output buffers SB1 to SBJ. The output buffers SB1 to SBJ receive the read data RSOD1 to RSODJ, respectively, and output the internal output data NSOD1 to NSODJ, respectively, in response to the data output control signal DOEN2. The output buffers SB1 to SBJ have substantially the same construction and operation as those of the output buffer FB1 and will not be described in order to avoid redundancy.

The output data latch unit 110 includes a plurality of output latches DF1 to DFJ. The output latches DF1 to DFJ latch the internal output data NFOD1 to NFODJ or NSOD1 to NSODJ, respectively, which are received from the output buffers FB1 to FBJ or SB1 to SBJ, in response to the read enable signal REb. In some embodiments, each of the output latches DF1 to DFJ may be implemented using a D flip-flop.

Figure 5:
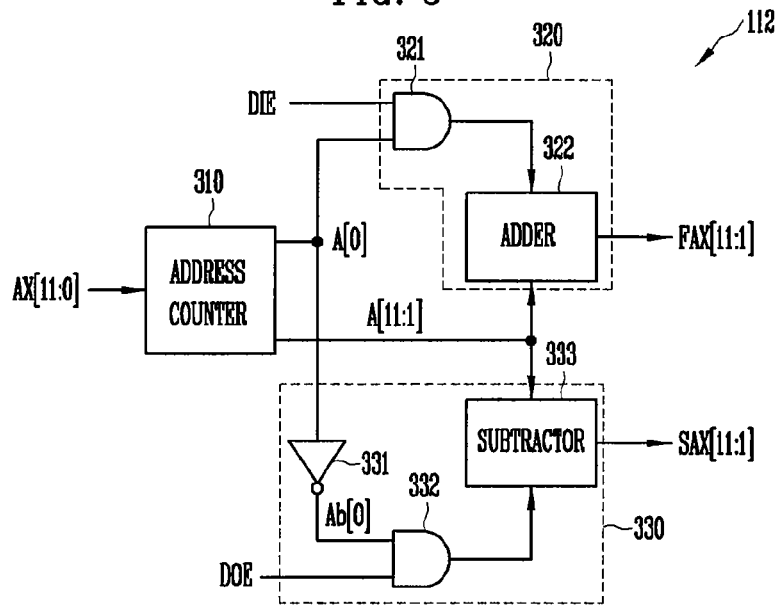
FIG. 5 is a detailed circuit diagram of a bank address generator shown in FIG. 1.

FIG. 5 is a detailed circuit diagram of the bank address generator 112 shown in FIG. 1. The bank address generator 112 includes an address counter 310, an addition unit 320, and a subtraction unit 330.

The address counter 310 generates internal address signals A[11:0] that are gradually increased from the external address signals AX[11:0] when receiving the external address signals AX[11:0]. In other words, the external address signals AX[11:0] are input to the address counter 310 as start address signals.

The addition unit 320 includes an AND gate 321 and an adder 322. The AND gate 321 outputs the internal address signal A[0] to the adder 322 or an output signal of a logic low in response to the data input enable signal DIE. In more detail, when the data input enable signal DIE is enabled, the AND gate 321 outputs the internal address signal A[0] to the adder 322. Furthermore, when the data input enable signal DIE is disabled, the AND gate 321 outputs the output signal of a logic low to the adder 322. The adder 322 adds a logic value of the internal address signal A[0] to a logic value of the internal address signals A[11:1] and outputs the addition result to the bank address signals FAX[11:1], if the internal address signal A[0] and the internal address signals A[11:1] are received. Furthermore, the adder 322 outputs the internal address signals A[11:1] as the bank address signals FAX[11:1] if the internal address signals A[11:1] are received when the AND gate 321 outputs the output signal of logic low.

The subtraction unit 330 includes an inverter 331, an AND gate 332, and a subtractor 333. The inverter 331 inverts the internal address signal A[0] and outputs an inverted internal address signal Ab[0]. The AND gate 332 outputs the inverted internal address signal Ab[0] to the subtractor 333 or an output signal of logic low in response to the data output enable signal DOE. In more detail, when the data output enable signal DOE is enabled, the AND gate 331 outputs the inverted internal address signal Ab[0] to the subtractor 333. In addition, when the data output enable signal DOE is disabled, the AND gate 331 outputs an output signal of logic low. The subtractor 333 subtracts a logic value of the inverted internal address signal Ab[0] from logic values of the internal address signals A[11:1] and outputs the subtraction result as the bank address signals SAX[11:1], if the inverted internal address signal Ab[0] and the internal address signals A[11:1] are received. The subtractor 333 also outputs the internal address signals A[11:1] as the bank address signals SAX[11:1] if the internal address signals A[11:1] are received when the AND gate 331 outputs the output signal of logic low.

Figure 6:
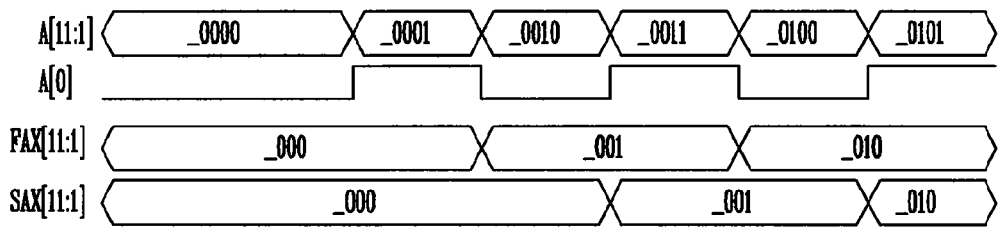
FIGS. 6 and 7 are timing diagrams of signals related to the operation of the bank address generator shown in FIG. 5.

Consequently, as shown in FIG. 6, when the data input enable signal DIE is enabled, the adder 322 outputs the addition result of the internal address signals A[11:1] and the internal address signal A[0] as the bank address signals FAX[11:1]. Furthermore, when the data input enable signal DIE is enabled, the subtractor 333 outputs the internal address signals A[11:1] as the bank address signals SAX[11:1].

Figure 7:
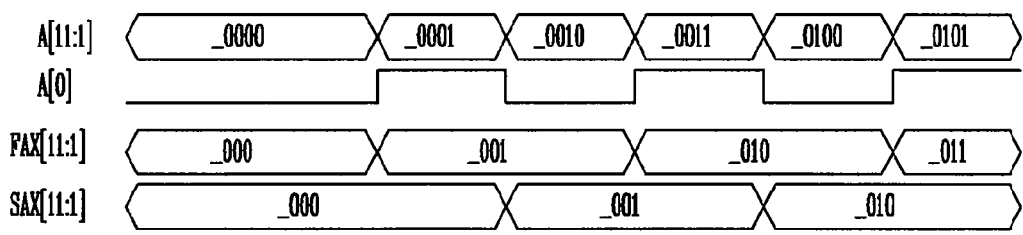

Referring to FIG. 7, when the data output enable signal DOE is enabled, the adder 322 outputs the internal address signals A[11:1] as the bank address signals FAX[11:1]. Furthermore, when the data output enable signal DOE is enabled, the subtractor 333 outputs the addition result of the internal address signals A[11:1] and the inverted internal address signal Ab[0] as the bank address signals SAX[11:1]].

Figure 8:
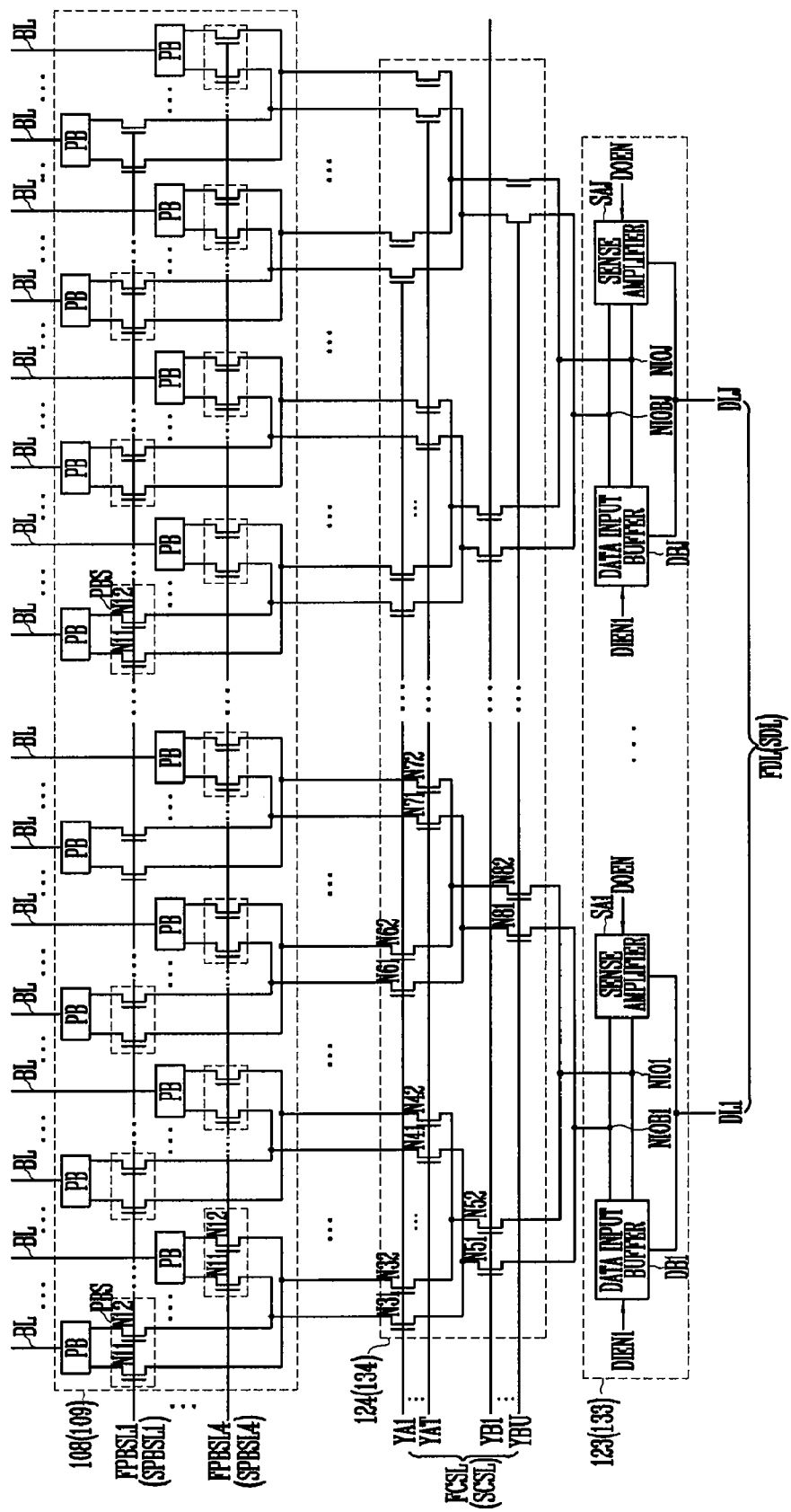
FIG. 8 is a detailed circuit diagram of a page buffer unit, a column selection unit, and an I/O controller shown in FIG. 1.

FIG. 8 relates to a detailed circuit diagram of the page buffer units 108, 109, the column selection units 124, 134, and the I/O controllers 123, 133 shown in FIG. 1. The page buffer units 108, 109 have substantially the same construction and operation; the column selection units 124, 134 have substantially the same construction and operation; and the I/O controllers 123, 133 have substantially the same construction and operation. The page buffer unit 108, the column selection unit 124, and the I/O controller 123 are described below as examples.

The page buffer unit 108 includes a plurality of page buffers PB and a plurality of buffer selection circuits PBS. The plurality of page buffers PB are connected to a plurality of bit lines BL, respectively, which are connected to memory cells (not shown) included in the memory bank MB1. Each of the plurality of page buffers PB stores one of the input data FID1 to FIDJ or one of the read data RFOD1 to RFODJ. The plurality of buffer selection circuits PBS are disposed in the plurality of page buffers PB, respectively, one by one and connect or disconnect the plurality of page buffers PB to or from the column selection unit 124 in response to the page buffer selection signals FPBSL1 to FPBSL4, respectively. In some embodiments, when one of the page buffer selection signals FPBSL1 to FPBSL4 is enabled, the remaining page buffer selection signals are disabled. Although only four page buffer selection signals FPBSL1 to FPBSL4 are shown in FIG. 8, it should be appreciated that the number of the page buffer selection signals may be increased or decreased, if appropriate. Each of the plurality of buffer selection circuits PBS may be implemented using NMOS transistors N11, N12.

The column selection unit 124 includes a plurality of NMOS transistors N31, N32 to N81, N82. The NMOS transistors N31, N32 to N81, N82 are turned on or off in response to column selection signals FCSL (i.e., YA1 to YAT, and YB1 to YBU (T, U are integers)). For example, the NMOS transistors N31, N32 are turned on or off in response to the column selection signal YA1. The NMOS transistors N31, N32 are turned on to connect some of the buffer selection circuits PBS to one terminals of the NMOS transistors N51, N52, respectively. Furthermore, the NMOS transistors N41, N42 are turned on or off in response to the column selection signal YAT. The NMOS transistors N41, N42 are turned on to connect some of the buffer selection circuits PBS to the other terminals of the NMOS transistors N51, N52, respectively. The NMOS transistors N61, N62, N71, and N72 operate in a similar way as the NMOS transistors N31, N32, N71, and N72. The NMOS transistors N51, N52 are turned on or off in response to the column selection signal YB1. The NMOS transistors N51, N52 are turned on to connect the page buffer PB connected thereto to the data I/O nodes NIOB1, NIO1, respectively. The NMOS transistors N81, N82 are turned on or off in response to the column selection signal YBU. The NMOS transistors N81, N82 are turned on to connect the page buffer PB connected thereto to the data I/O nodes NIOB1, NIO1, respectively. When one of the page buffer selection signals FPBSL1 to FPBSL4 is enabled, one of the column selection signals YA1 to YAT and one of the column selection signals YB1 to YBU are enabled. Accordingly, one page buffer PB is connected to the data I/O nodes NIOB1, NIO1.

The I/O controller 123 includes data input buffers DB1 to DBJ and sense amplifiers SA1 to SAJ. The data input buffers DB1 to DBJ and the sense amplifiers SA1 to SAJ are connected between data lines DL1 to DLJ and data I/O nodes NIOB1 to NIOBJ, NIO1 to NIOJ, respectively. For example, the data input buffer DB1 and the sense amplifier SA1 may be connected between the data line DL1 and the data I/O nodes NIOB1, NIO1. The data input buffer DB1 outputs input data (for example, FID1), which are received through the data line DL1, to the data I/O nodes NIOB1, NIO1 in response to the data input control signal DIEN1. At this time, the data input buffer DB1 outputs complementary data FID1B of the input data FID1 and the input data FID1 to the data I/O nodes NIOB1, NIO1. The data input buffers DB2 to DBJ also operate in a similar way as the data input buffer DB1 in response to the data input control signal DIEN1. The sense amplifier SA1 senses and amplifies complementary data RFOD1B of read data (for example, RFOD1), which are received through the data I/O nodes NIOB1, NIO1, and the read data RFOD1 and outputs the result to the data line DL1, in response to the data output enable signal DOEN. The sense amplifiers SA2 to SAJ also operate in a similar way as the sense amplifier SA1 in response to the data output enable signal DOEN.

Figure 9:
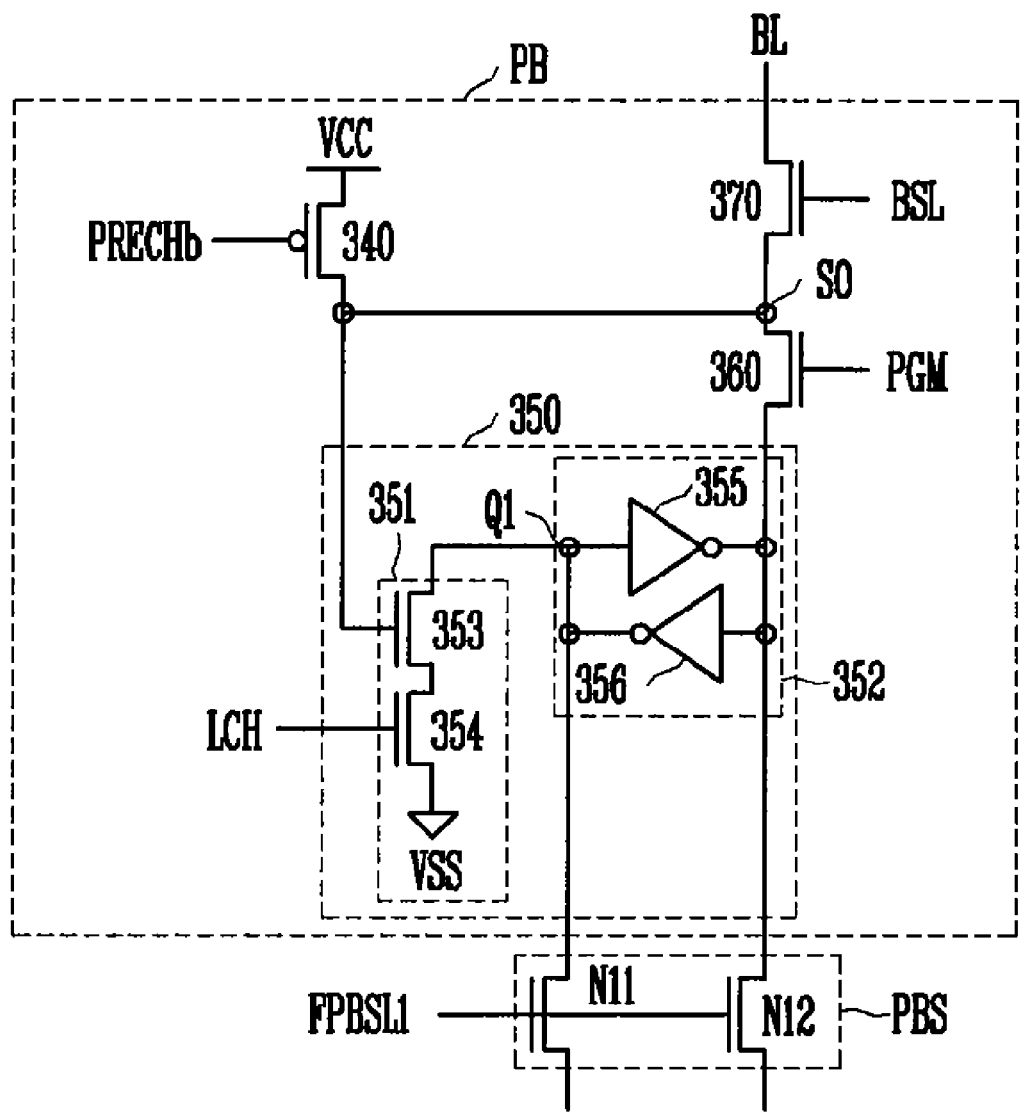
FIG. 9 is a detailed circuit diagram of a page buffer and a buffer selection circuit shown in FIG. 8.

FIG. 9 is a detailed circuit diagram of the page buffer PB and the buffer selection circuit PBS shown in FIG. 8. The page buffer includes a page buffer (PB) precharge circuit 340, a register circuit 350, a program control circuit 360, and a bit line selection circuit 370.

The precharge circuit 340 may be implemented using a PMOS transistor and precharges the sensing node SO to an internal voltage (VCC) level in response to a precharge control signal PRECHb. The register circuit 350 includes a sensing circuit 351 and a latch circuit 352. The sensing circuit 351 includes NMOS transistors 353, 354 and the latch circuit 352 includes inverters 355, 356. The sensing circuit 351 senses a voltage level of the sensing node SO and outputs sensing data (not shown) to a first node Q1, in response to a latch signal LCH. The latch circuit 352 latches the sensing data received from the first node Q1 and outputs inverted sensing data to the second node Q2, during a read operation. Furthermore, during a program operation, the latch circuit 352 latches complementary input data (for example, FID1B, FID1) that are received through the first and second nodes Q1, Q2, respectively. The program control circuit 360 may be implemented using a NMOS transistor and outputs the input data FID1 stored in the latch circuit 352 to the sensing node SO in response to the program control signal PGM. The bit line selection circuit 370 may be implemented using a NMOS transistor and connects a bit line BL to the sensing node SO in response to a bit line selection signal BSL. NMOS transistors N11, N12 of a page buffer selection circuit PBS are connected to the first and second nodes Q1, Q2, respectively.

Figure 10:
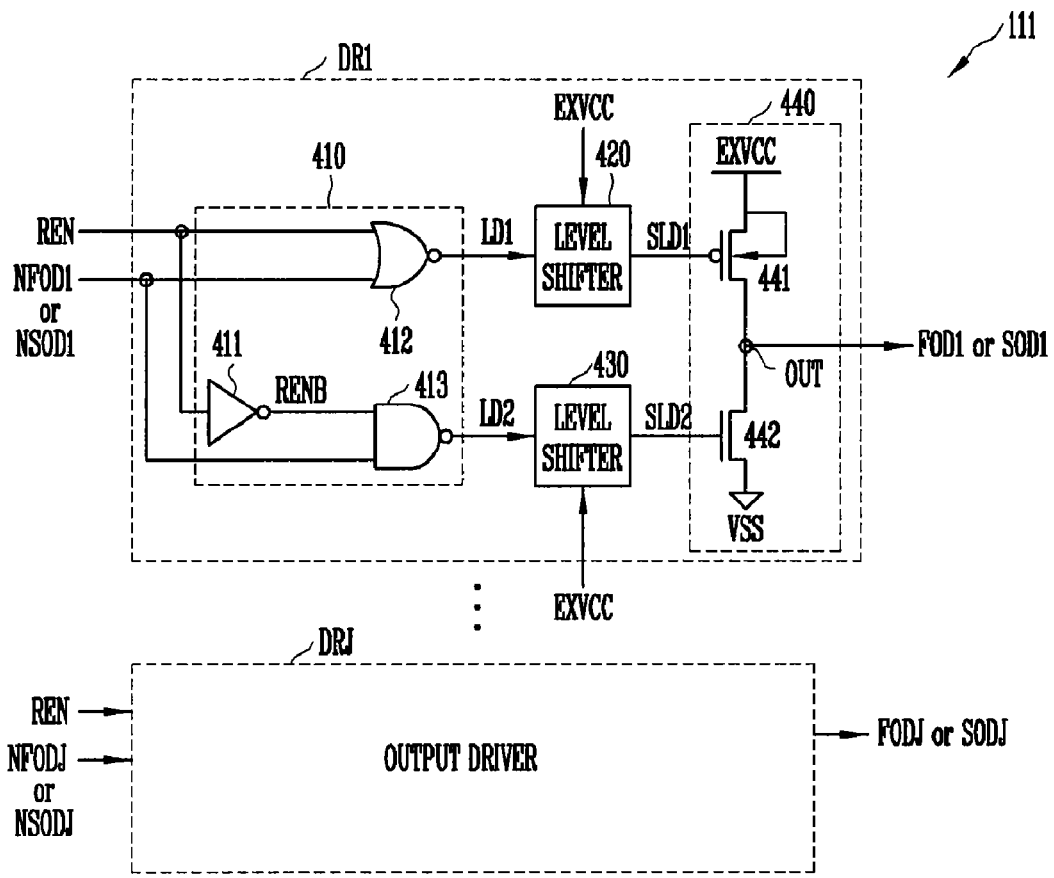
FIG. 10 is a detailed circuit diagram of an output driver unit shown in FIG. 1.

FIG. 10 is a detailed circuit diagram of the output driver unit 111 shown in FIG. 1. The output driver unit 111 includes a plurality of output drivers DR1 to DRJ respectively operating in response to the read enable control signal REN. The output drivers DR1 to DRJ have substantially the same construction and operation and only the output driver DR1 will be described as an example. The output driver DR1 includes an output logic circuit 410, level shifters 420, 430, and an output circuit 440.

Figure 11:
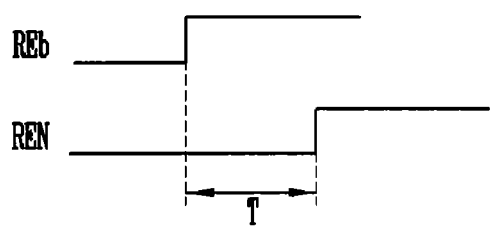
FIG. 11 is a timing diagram of an output control signal and a write enable signal respectively input to output drivers shown in FIG. 10.

The output logic circuit 410 includes an inverter 411, a NOR gate 412, and a NAND gate 413. The inverter 411 inverts the read enable control signal REN and outputs an inverted read enable control signal RENB. The read enable control signal REN is a signal in which a rising edge of a read enable signal REb is delayed for a time T, as shown in FIG. 11.

As a result, the output data latch unit 110 outputs the internal output data NFOD1 or NSOD1 according to the read enable signal REb and the output driver DR1 operates according to the read enable control signal REN after a predetermined delay time. Accordingly, a data hold time of the output data latch unit 110 can be secured. The NOR gate 412 outputs a logic signal LD1 in response to the read enable control signal REN and the internal output data NFOD1 or NSOD1. The NAND gate 413 outputs a logic signal LD2 in response to the inverted read enable control signal RENB and the internal output data NFOD1 or NSOD1. In some embodiments, when one of the logic signals LD1, LD2 becomes a logic high, the other of the logic signals LD1, LD2 becomes a logic low.

The level shifters 420, 430 use the external voltage EXVCC as an operating power supply. The level shifter 420 changes a voltage of the logic signal LD1 to the external voltage (EXVCC) level and outputs an output signal SLD1, when the logic signal LD1 is logic high. The level shifter 430 changes a voltage of the logic signal LD2 to the external voltage (EXVCC) level and outputs an output signal SLD2, when the logic signal LD2 is logic high.

The output circuit 440 includes a PMOS transistor 441 and a NMOS transistor 442. The PMOS transistor 441 is turned on or off in response to the output signal SLD1. The PMOS transistor 441 is turned on to supply an output node OUT with the external voltage EXVCC. The NMOS transistor 442 is turned on or off in response to the output signal SLD2. The NMOS transistor 442 is turned on to discharge the output node OUT to a ground voltage VSS. Consequently, the output circuit 440 outputs output data FOD1 or SOD1 of logic low or high to the output node OUT in response to the output signals SLD1, SLD2.

FIG. 12 is a timing diagram of signals related to the data input operation of the flash memory device shown in FIG. 1. The chip enable signal CEb is kept to logic low while the flash memory device 100 executes the data input operation. Meanwhile, the command signal CMD, the external address signals AX[27:0], and the input data FID1 to FIDJ, SID1 to SIDJ are sequentially input to the input buffer unit 102. The input buffer unit 102 receives the command signal CMD including a page program set-up code 80h and outputs the command signal CMD to the command buffer 114, in response to the chip enable signal CEb.

When a command latch enable signal CLE becomes logic high and a write enable signal Web becomes logic low, a command clock signal CCLK is toggled. The command buffer 114 receives the command signal CMD and outputs the command signal CMD to the control logic circuit 115, in response to the command clock signal CCLK. The control logic circuit 115 generates a program command PGM in response to the command signal CMD.

Meanwhile, the control logic circuit 115 disables a ready/busy bar signal R/Bb (not shown) during a set time if the command signal CMD including a confirmation code 10h is received, so that an external device receives the ready/busy bar signal R/Bb and the flash memory device 100 recognizes that the state is a program operation state. The high-voltage generator 116 generates a bias voltage HV corresponding to the program operation and outputs the bias voltage HV to the X-decoder 117, in response to the program command PGM. Furthermore, the input buffer unit 102 receives the external address signals AX[27:0] and outputs them to the address buffer 103.

When the address latch enable signal ALE becomes logic high and the write enable signal WEb becomes logic low, the address clock signal ACLK is toggled. The address buffer 103 receives the external address signals AX[27:0] (corresponding to "ADD" in FIG. 12) and outputs the external address signals AX[27:12] to the X-decoder 117, the external address signals AX[11:0] to the bank address generator 112, and the external address signals AX[2:0] to the control signal generator 104, in response to the address clock signal ACLK.

The X-decoder 117 decodes the external address signals AX[27:12] and selects one of a plurality of pages included in the memory banks MB1, MB2, respectively, according to the decoding result. The control signal generator 104 alternately toggles the latch clock signals DCLK1, DCLK2 and alternately toggles the data input control signals DIEN1, DIEN2, in response to the external address signal AX[0] and the write enable signal Web. In some embodiments, when the external address signal AX[0] is logic high and the write enable signal WEb is logic low, the control signal generator 104 enables the latch clock signal DCLK2 and the data input control signal DIEN1. Furthermore, when the external address signal AX[0] is logic low and the write enable signal WEb is logic low, the control signal generator 104 enables the latch clock signal DCLK1 and the data input control signal DIEN2.

Since data output enable signal DOE is disabled during the data input operation of the flash memory device 100, the control signal generator 104 outputs both the data output control signals DOEN1, DOEN2 as logic high. As a result, the sense amplifiers SA1 to SAJ of the I/O controllers 123, 133 are all disabled in response to the data output control signals DOEN1, DOEN2. The control signal generator 104 generates page buffer selection signals FPBSL1 to FPBSL4, SPBSL1 to SPBSL4 in response to the data output enable signal DOE, the data input control signals DIEN1, DIEN2, and the external address signals AX[2:0].

The bank address generator 112 generates the internal address signals A[11:0] that are gradually increased based on the external address signals AX[11:0]. The bank address generator 112 generates bank address signals FAX[11:1], SAX[11:1] based on the data input enable signal DIE, the data output enable signal DOE, and the internal address signals A[11:0]. The Y-decoder 113 decodes the bank address signals FAX[11:1], SAX[11:1], respectively, and generates the column selection signals FCSL, SCSL according to the decoding result.

Meanwhile, when the latch clock signal DCLK1 is enabled (i.e., at a first rising edge of the latch clock signal DCLK1), the input buffer unit 102 outputs the input data FID1 to FIDJ to the input data latch unit 121. The input data latch unit 121 latches the input data FID1 to FIDJ and outputs them to the input data buffer unit 122, in response to the latch clock signal DCLK1. In FIG. 12, the input data FID1 to FIDJ firstly input to the input data latch unit 121 are indicated by "D0" and the input data FID1 to FI secondly input to the input data latch unit 121 are indicated by "D2" for the simplification of the drawing. Furthermore, when the latch clock signal DCLK2 is enabled, the input buffer unit 102 outputs the input data SID1 to SIDJ to the input data latch unit 131.

The input data latch unit 131 latches the input data SID1 to SIDJ and outputs them to the input data buffer unit 122, in response to the latch clock signal DLCK2. In FIG. 12, the input data SID1 to SIDJ firstly input to the input data latch unit 131 are indicated by "D1" and the input data SID1 to SIDJ secondly input to the input data latch unit 1310 are indicated by "D3" for the simplification of the drawing. While the input data latch unit 131 latches the input data SID1 to SIDJ, the input data buffer unit 122 outputs the input data FID1 to FIDJ, which are received from the input data latch unit 121, to the data input buffers DB1 to DBJ of the I/O controller 123 through the data line FDL. The data input buffers DB1 to DBJ of the I/O controller 123 output the input data FID1 to FIDJ and its complementary data to the data I/O nodes NIO1 to NIOJ, NIOB1 to NIOBJ of the I/O controller 123, respectively, in response to the data input control signal DIEN1.

A part of the plurality of buffer selection circuits PBS included in the page buffer unit 108 connect some of the plurality of page buffers PB included in the page buffer unit 108 to the column selection unit 124 in response to the page buffer selection signals FPBSL1 to FPBSL4. The column selection unit 124 connects the data I/O nodes NIO1 to NIOJ, NIOB1 to NIOBJ to some of the plurality of page buffers PB included in the page buffer unit 108 in response to the column selection signals FCSL (YA1 to YAT, YB1 to YBU). As a result, the input data FID1 to FIDJ are input to some of the plurality of page buffers PB.

Thereafter, at a second rising edge of the latch clock signal DCLK1, the input data latch unit 121 latches the input data FID1 to FIDJ received from the input buffer unit 102 and outputs them to the input data buffer unit 122. While the input data latch unit 121 latches the input data FID1 to FIDJ, the input data buffer unit 132 outputs the input data SID1 to SIDJ, which are received from the input data latch unit 131, to the data input buffers DB1 to DBJ of the I/O controller 133, respectively, through the data line SDL.

The data input buffers DB1 to DBJ of the I/O controller 133 output the input data SID1 to SIDJ and its complementary data to the data I/O nodes NIO1 to NIOJ, NIOB1 to NIOBJ of the I/O controller 133, respectively, in response to the data input control signal DIEN2. A part of the plurality of buffer selection circuits PBS included in the page buffer unit 109 connect some of the plurality of page buffers PB included in the page buffer unit 109 to the column selection unit 134 in response to the page buffer selection signals SPBSL1 to SPBSL4.

The column selection unit 134 connects the data I/O nodes NIO1 to NIOJ, NIOB1 to NIOBJ to some of the plurality of page buffers PB included in the page buffer unit 109 in response to the column selection signals SCSL (YA1 to YAT, YB1 to YBU). As a result, the input data SID1 to SIDJ are input to some of the plurality of page buffers PB. Thereafter, the above-mentioned operation is repeated, so that the input data are alternately input to the page buffer unit 108 and the page buffer unit 109.

As described above, in the data input operation of the flash memory device 100, input data are alternately input to the page buffer unit 108, 109 corresponding to the memory banks MB1, MB2, respectively, in an interleaving manner. Accordingly, the data input speed of the flash memory device 100 can be increased.

Figure 13:
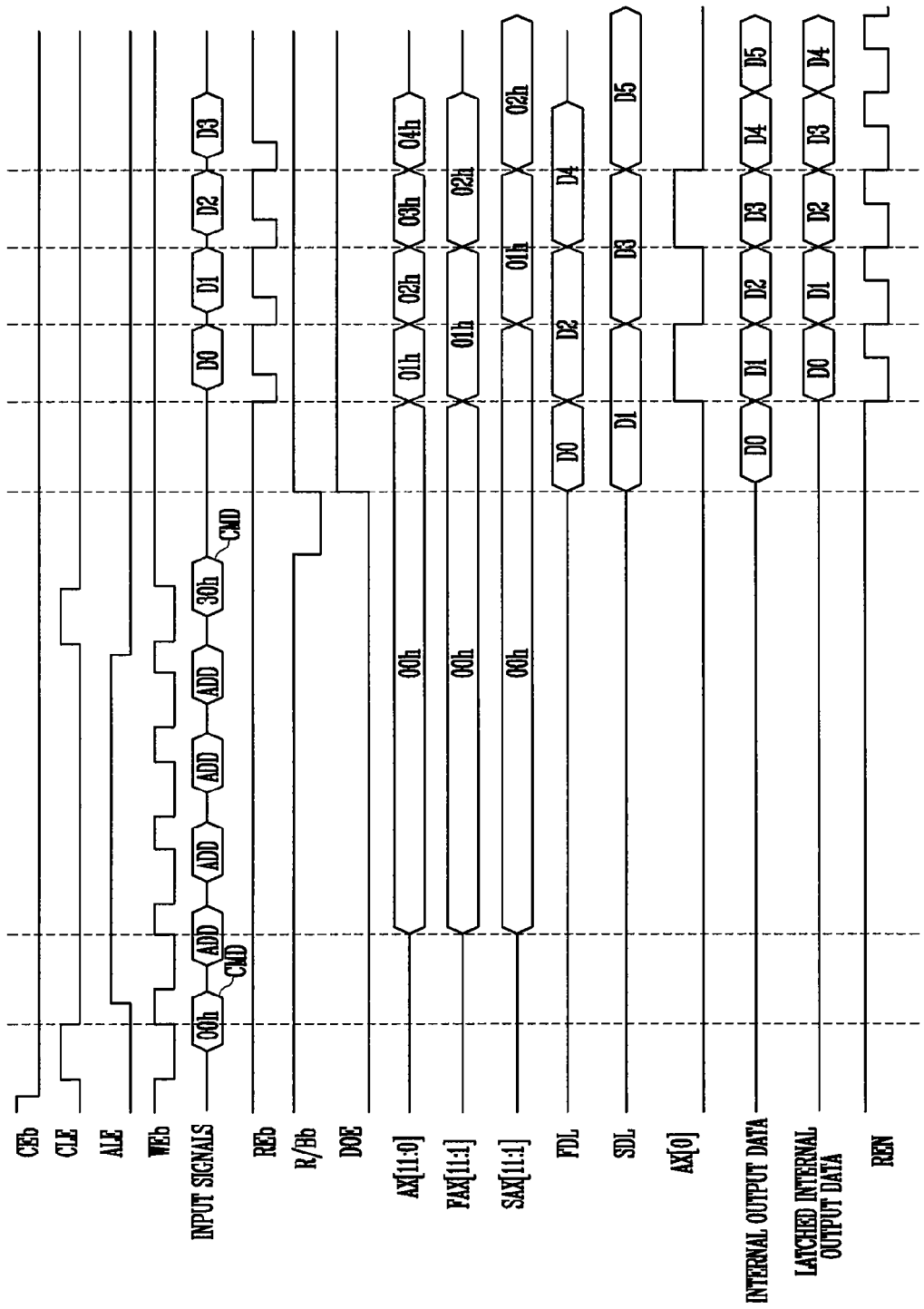
FIG. 13 is a timing diagram of signals related to a data output operation of the flash memory device shown in FIG. 1.

FIG. 13 is a timing diagram of signals related to the data output operation of the flash memory device shown in FIG. 1. The data output operation of the flash memory device 100 is similar to the data input operation of the flash memory device 100, which has been described with reference to FIG. 12, except for several differences.

During a data output operation of the flash memory device 100, the data input enable signal DIE is disabled. Accordingly, the input data buffer units 122, 132 are disabled in response to the data input enable signal DIE. Meanwhile, while the flash memory device 100 executes the data output operation, the chip enable signal CEb is kept to logic low. The command signal CMD and the external address signals AX[27:0] are sequentially input to the input buffer unit 102. The input buffer unit 102 receives the command signal CMD including a read set-up code 00h and outputs it to the command buffer 114, in response to the chip enable signal CEb. When the command latch enable signal CLE becomes logic high and the write enable signal WEb becomes logic low, the command clock signal CCLK is toggled.

The command buffer 114 receives the command signal CMD and outputs it to the control logic circuit 115, in response to the command clock signal CCLK. The control logic circuit 115 generates the read command READ in response to the command signal CMD. Meanwhile, the control logic circuit 115 disables the ready/busy bar signal R/Bb during a set time if the command signal CMD including a confirmation code 30h is received, so that the external device receives the ready/busy bar signal R/Bb and the flash memory device 100 recognizes that the state is a read operation state.

The high-voltage generator 116 generates a bias voltage HV corresponding to the read operation and outputs the bias voltage HV to the X-decoder 117, in response to the program command PGM. Furthermore, the input buffer unit 102 receives the external address signals AX[27:0] and outputs them to the address buffer 103. When the address latch enable signal ALE becomes logic high and the write enable signal WEb becomes logic low, the address clock signal ACLK is toggled. The address buffer 103 receives the external address signals AX[27:0] (corresponding to "ADD" in FIG. 13) and outputs the external address signals AX[27:12] to the X-decoder 117, the external address signals AX[11:0] to the bank address generator 112, and the external address signals AX[2:0] to the control signal generator 104, in response to the address clock signal ACLK.

The X-decoder 117 decodes the external address signals AX[27:12] and selects one of a plurality of pages included in the memory banks MB1, MB2, respectively, according to the decoding result. The control signal generator 104 alternately toggles the data output control signals DOEN1, DOEN2 in response to the external address signal AX[0] and the data output enable signal DOE. In some embodiments, when the external address signal AX[0] is logic high and the data output enable signal DOE is logic high, the control signal generator 104 enables the data output control signal DOEN2 and disables the data output control signal DOEN1. Furthermore, when the external address signal AX[0] is logic low and the data output enable signal DOE is logic high, the control signal generator 104 enables the data output control signal DOEN1 and disables the data output control signal DOEN2.

The control signal generator 104 generates the page buffer selection signals FPBSL1 to FPBSL4, SPBSL1 to SPBSL4 in response to the data output enable signal DOE, the data input control signals DIEN1, DIEN2, and the external address signals AX[2:0]. A part of a plurality of buffer selection circuits PBS included in the page buffer unit 108 connects some of a plurality of page buffers PB included in the page buffer unit 108 to the column selection unit 124 in response to the page buffer selection signals FPBSL1 to FPBSL4. Furthermore, some of a plurality of buffer selection circuits PBS included in the page buffer unit 109 connects some of a plurality of page buffers PB included in the page buffer unit 109 to the column selection unit 134 in response to the page buffer selection signals SPBSL1 to SPBSL4.

The bank address generator 112 generates the bank address signals FAX[11:1] and SAX[11:1] based on the external address signals AX[11:0]. The Y-decoder 113 decodes the bank address signals FAX[11:1] and SAX[11:1], respectively, and generates the column selection signals FCSL and SCSL according to the decoding result. The column selection unit 124 connects the data I/O nodes NIO1 to NIOJ and NIOB1 to NIOBJ of the I/O controller 123 to some of the plurality of page buffers PB included in the page buffer unit 108 in response to the column selection signals FCSL (YA1 to YAT, YB1 to YBU). As a result, the read data RFOD1 to RFODJ sensed by some of the plurality of page buffers PB and its complementary data (not shown) are transferred to the data I/O nodes NIO1 to NIOJ and NIOB1 to NIOBJ.

The I/O controller 123 outputs the read data RFOD1 to RFODJ, which are received from the data I/O nodes NIO1 to NIOJ and NIOB1 to NIOBJ, to the data lines FDL (DL1 to DLJ) in response to the data output enable signal DOE. When the data output control signal DOEN1 is enabled, the output data buffer unit 125 outputs the internal output data NFOD1 to RFODJ in response to the read data RFOD1 to RFODJ received through the data lines FDL (DL1 to DLJ).

Meanwhile, the column selection unit 134 connects the data I/O nodes NIO1 to NIOJ, NIOB1 to NIOBJ of the I/O controller 133 to some of a plurality of page buffers PB included in the page buffer unit 109 in response to the column selection signals SCSL (YA1 to YAT, YB1 to YBU). As a result, the read data RSOD1 to RSODJ sensed by some of the plurality of page buffers PB and its complementary data (not shown) are transferred to the data I/O nodes NIO1 to NIOJ, NIOB1 to NIOBJ.

The I/O controller 133 outputs the read data RSOD1 to RSODJ, which are received from the data I/O nodes NIO1 to NIOJ and NIOB1 to NIOBJ, to the data lines SDL (DL1 to DLJ), respectively, in response to the data output enable signal DOE. When the data output control signal DOEN2 is enabled, the output data buffer unit 135 outputs the internal output data NSOD1 to RSODJ in response to the read data RSOD1 to RSODJ received through the data lines SDL (DL1 to DLJ). When the data output control signals DOEN1, DOEN2 are alternately enabled, the read enable signal REb is consecutively toggled.

The output data latch unit 110 latches the internal output data NFOD1 to RFODJ at a first rising edge of the read enable signal REb and outputs the internal output data NFOD1 to RFODJ to the output driver unit 111 at a first falling edge of the read enable signal REb. Furthermore, the output data latch unit 110 latches the internal output data NSOD1 to RSODJ at a second rising edge of the read enable signal REb and outputs the internal output data NSOD1 to RSODJ to the output driver unit 111 at a second falling edge of the read enable signal REb.

The output driver unit 111 alternately receives the internal output data NFOD1 to RFODJ and the internal output data NSOD1 to RSODJ from the output data latch unit 110 and alternately outputs the output data FOD1 to FODJ and the output data SOD1 to SODJ, in response to the read enable control signal REN. The read enable control signal REN is a signal in which the rising edge of the read enable signal REb is delayed for a set time T (refer to FIG. 11).

As described above, in the data output operation of the flash memory device 100, read data from the page buffer unit 108, 109 respectively corresponding to the memory banks MB1, MB2 are alternately output by the output data buffer units 125, 135 in an interleaving manner. Therefore, the data output speed of the flash memory device 100 can be enhanced.

As described above, in accordance with the flash memory device and data I/O operation method according to the present invention, data I/O operations of page buffers of divided two or more groups are executed in an interleaving manner. Accordingly, the data I/O speed can be increased.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A non-volatile memory device comprising:
   a memory cell array including a plurality of memory banks, the plurality of memory banks including first and second memory banks;
   an input buffer unit that receives external address signals, first input data and second input data from an external device;
   a first data handling unit that receives the first input data from the input buffer;
   a second data handling unit that receives the second input data from the input buffer;
   a first page buffer unit that receives the first input data transmitted from the first data handling unit and transmits the first input data to the first memory bank; and
   a second page buffer unit that receives the second input data transmitted from the second data handling unit and transmits the second input data to the second memory bank,
   wherein while the second data handling unit latches the second input data, the first data handling unit transfers the first input data to the first page buffer unit, and
   while the first data handling unit latches the first input data, the second data handling unit transfers the second input data to the second page buffer unit.

2. The non-volatile memory device of claim 1, wherein the input buffer sequentially receives the external address signals, the first input data and the second input data from the external device in response to a chip enable signal.

3. The non-volatile memory device of claim 1, wherein the first and second data handling units are first and second I/O units, respectively.

4. The non-volatile memory device of claim 1, wherein the input buffer unit further receives a command signal from the external device in response to a chip enable signal, and the external address signals include first external address signals and second external address signals.

5. The non-volatile memory device of claim 4, further comprising:
   a control signal generator that generates the first and second control signals based on some of the first external address signals, a write enable signal, and a data output enable signal;
   a command buffer that receives the command signal from the input buffer unit in response to a command clock signal; and
   an address buffer that receives the first and second external address signals and outputs some of the first external address signals to the control signal generator, in response to the address clock signal.

6. The non-volatile memory device of claim 5, wherein the first control signals include a first latch clock signal, a first data input control signal, and a first data output control signal, the second control signals include a second latch clock signal, a second data input control signal, and a second data output control signal, and some of the first external address signals include first to third address signals,
   wherein the control signal generator comprises:
   an input control circuit that generates the first and second latch clock signals and the first and second data input control signals in response to the first address signal and the write enable signal; and
   an output control circuit that generates the first and second data output control signals in response to the first address signal and the data output enable signal.

7. The non-volatile memory device of claim 6, wherein the control signal generator further comprises a selection control circuit that generates first page buffer selection signals and second page buffer selection signals in response to the second and third address signals and the data output enable signal.

8. The non-volatile memory device of claim 4, further comprising:
- a bank address generator that generates bank address signals based on the second external address signals, the data input enable signal, and the data output enable signal; and
- a Y-decoder that decodes the bank address signals and generates the first column selection signals and the second column selection signals according to the decoded bank address signals.

9. A non-volatile memory device comprising:
- a memory cell array including a plurality of memory banks, the plurality of memory banks including first and second memory banks;
- an input buffer unit that receives external address signals from an external device;
- a first page buffer unit that receives a first output data from the first memory bank;
- a second page buffer unit that receives a second output data from the second memory bank;
- a first data handling unit that receives the first output data from the first page buffer;
- a second data handling unit that receives the second output data from the second page buffer; and
- an output driver unit that receives the first and second output data from the first and second page buffers and outputs the first and second output data to the external device,
- wherein the first data handling unit transfers the first output data to the output driver unit when the second data handling unit receives the second output data from the second page buffer,
- wherein the second data handling unit transfers the second output data to the output driver unit when the first data handling unit receives the first output data from the first page buffer.

10. The non-volatile memory device of claim 9, wherein the first and second data handling units are first and second I/O units, respectively.

* * * * *